United States Patent
Ueyama

(10) Patent No.: US 9,685,722 B2
(45) Date of Patent: Jun. 20, 2017

(54) UPPER PLATE BIASING UNIT AND ELECTRICAL COMPONENT SOCKET

(71) Applicant: ENPLAS CORPORATION, Kawaguchi (JP)

(72) Inventor: Yuki Ueyama, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 14/913,838

(22) PCT Filed: Aug. 25, 2014

(86) PCT No.: PCT/JP2014/072093
§ 371 (c)(1),
(2) Date: Feb. 23, 2016

(87) PCT Pub. No.: WO2015/029920
PCT Pub. Date: Mar. 5, 2015

(65) Prior Publication Data
US 2016/0365657 A1    Dec. 15, 2016

(30) Foreign Application Priority Data

Aug. 29, 2013    (JP) .................................. 2013-177647

(51) Int. Cl.
*H01R 12/73*    (2011.01)
*H01R 12/91*    (2011.01)
(Continued)

(52) U.S. Cl.
CPC ......... *H01R 12/73* (2013.01); *H01R 12/7005* (2013.01); *H01R 12/91* (2013.01);
(Continued)

(58) Field of Classification Search
CPC ............ H01R 2201/20; H01R 12/7076; H01R 12/714; H01R 13/2421; H01R 12/7005;
(Continued)

(56) References Cited

U.S. PATENT DOCUMENTS 5,127,837 A * 7/1992 Shah ..................... G01R 1/0408
439/248
5,534,787 A * 7/1996 Levy .................. G01R 1/07314
324/754.09
(Continued)

FOREIGN PATENT DOCUMENTS

JP    61-69570    5/1986
JP    8-69848    3/1996
(Continued)

OTHER PUBLICATIONS

International Search Report mailed Sep. 22, 2014, in corresponding International Application No. PCT/JP2014/072093.

*Primary Examiner* — James Harvey
*Assistant Examiner* — Matthew T Dzierzynski
(74) *Attorney, Agent, or Firm* — Staas & Halsey LLP

(57) ABSTRACT

The present invention includes a lower plate, an upper plate provided above the lower plate in such a manner that the upper plate is biased so as to be vertically movable, a guide member attached to the upper plate, the guide member guiding vertical movement of the upper plate, and a spring provided below the guide member, the spring biasing the upper plate upward via the guide member. In the lower plate, an insertion hole having a size that allows the spring and the guide member to pass therethrough in a vertical direction is formed. In the insertion hole, a spring holding member that holds the spring is detachably provided. Such configuration enables suppression of warpage of the upper plate caused by (Continued)

a biasing force of the spring and enables work for replacement of the upper plate to be performed easily and quickly.

4 Claims, 8 Drawing Sheets

(51) Int. Cl.
  *H05K 7/10* (2006.01)
  *H05K 1/18* (2006.01)
  *H01R 12/70* (2011.01)

(52) U.S. Cl.
  CPC ............. *H05K 1/18* (2013.01); *H05K 7/1069* (2013.01); *H01R 12/7076* (2013.01)

(58) Field of Classification Search
  CPC .... H01R 12/91; H01R 12/57; H01R 12/7047; H01R 13/24; H01R 23/7005; H05K 7/1069; H05K 1/18; H05K 7/1061
  USPC .................................................. 439/331, 700
  See application file for complete search history.

(56) References Cited

U.S. PATENT DOCUMENTS

| | | | | |
|---|---|---|---|---|
| 5,865,639 A * | 2/1999 | Fuchigami | ........... | G01R 1/0466 361/709 |
| 6,863,541 B2 * | 3/2005 | Kagami | ............ | H01R 13/2435 439/71 |
| 7,335,030 B2 * | 2/2008 | Kunioka | .............. | G01R 1/0433 324/754.08 |
| 7,381,062 B2 * | 6/2008 | Shimada | ............ | G01R 1/06722 439/66 |
| 8,076,952 B2 * | 12/2011 | Yoshida | ................ | G01R 1/0466 324/756.02 |
| 8,143,909 B2 * | 3/2012 | Ryu | ..................... | G01R 1/0483 324/750.16 |
| 8,342,872 B2 * | 1/2013 | Suzuki | ................. | G01R 1/0466 439/331 |
| 8,556,639 B2 * | 10/2013 | Ueyama | ................. | H01R 12/91 439/66 |
| 8,562,367 B2 * | 10/2013 | Yokoyama | ........... | G01R 1/0466 439/331 |
| 8,721,358 B2 * | 5/2014 | Hayakawa | ............. | H01R 13/62 439/372 |
| 9,017,081 B2 * | 4/2015 | Ueyama | ............ | H01R 12/7076 439/64 |
| 2003/0224650 A1 | 12/2003 | Kagami | | |
| 2009/0230983 A1 | 9/2009 | Yoshida | | |
| 2012/0100730 A1 | 4/2012 | Yokoyama | | |
| 2013/0164963 A1 | 6/2013 | Ueyama | | |

FOREIGN PATENT DOCUMENTS

| | | |
|---|---|---|
| JP | 2003-308936 | 10/2003 |
| JP | 2003-347001 | 12/2003 |
| JP | 2008-34173 | 2/2008 |
| JP | 2012-89389 | 5/2012 |
| JP | 2013-134854 | 7/2013 |

* cited by examiner

US 9,685,722 B2

UPPER PLATE BIASING UNIT AND ELECTRICAL COMPONENT SOCKET

CROSS-REFERENCE TO RELATED APPLICATIONS

This application is a U.S. National Stage application, which claims the benefit under 35 U.S.C. §371 of PCT International Patent Application No. PCT/JP2014/072093, filed Aug. 25, 2014, which claims the foreign priority benefit under 35 U.S.C. §119 of Japanese Patent Application No. 2013-177647, filed Aug. 29, 2013, the contents of which are incorporated herein by reference.

TECHNICAL FIELD

This invention relates to an upper plate biasing unit that biases an upper plate upward so that the upper plate is vertically movable, and an electrical component socket including a socket body that receives a first electrical component and is disposed on a second electrical component, the first electrical component and the second electrical component being electrically connected to each other via a contact element disposed in a socket body.

BACKGROUND ART

Conventionally, as this type of "electrical component sockets", there are IC sockets that detachably receive an IC package, which corresponds to a "first electrical component". The IC sockets are disposed on a wiring substrate, which corresponds to a "second electrical component", and include a resin socket body that receives the IC package.

As these socket bodies, ones that include a floating plate disposed above a second electrical component and including a through hole formed therein, the through hole allowing an contact element to be inserted therein, the floating plate receiving a first electrical component and being supported on the upper side of the socket body so as to be vertically movable, a guide member, such as a rivet, attached to the floating plate, the guide member being supported by the socket body so as to be vertically movable and guiding vertical movement of the floating plate, and a spring provided between the socket body and the guide member, the spring biasing the floating plate upward via the guide member have been proposed (see, for example, Japanese Patent Laid-Open No. 2013-134854). IC sockets including a socket body having such configuration as above have the advantage of enabling suppression of warpage of the floating plate caused by a biasing force of the spring even if a flexural rigidity of the floating plate is small because a point of application of the biasing force of the spring to the floating plate and a point of support of the floating plate correspond to each other in plan view.

SUMMARY OF INVENTION

Technical Problem

However, in such conventional techniques as above, the spring is provided below the guide member, and the guide member cannot be removed unless the socket body is disassembled. As a result, the conventional techniques have the disadvantage of being cumbersome and requiring a lot of trouble, e.g., when the floating plate is replaced according to the type of the IC package or when the spring is replaced in order to change a biasing force (spring constant of the spring) of the floating plate.

Such circumstances apply not only to electrical component sockets, but also to upper plate biasing units including a lower plate, an upper plate provided above the lower plate in such a manner that the upper plate is biased so as to be vertically movable, a guide member attached to the upper plate, the guide member guiding vertical movement of the upper plate, and a spring provided below the guide member, the spring biasing the upper plate upward via the guide member.

Therefore, an object of this invention is to provide an upper plate biasing unit and an electrical component socket that enable work for replacing an upper plate or a floating plate or a spring to be performed easily and quickly in addition to the advantage of enabling suppression of warpage of the upper plate or the floating plate even if a flexural rigidity of the upper plate or the floating plate is small.

Solution to Problem

In order to achieve the above object, an upper plate biasing unit according to the present invention is an upper plate biasing unit including a lower plate, an upper plate provided above the lower plate in such a manner that the upper plate is biased so as to be vertically movable, a guide member attached to the upper plate, the guide member guiding vertical movement of the upper plate, and a spring provided below the guide member, the spring biasing the upper plate upward via the guide member, wherein: in the lower plate, an insertion hole having a size that allows the spring and the guide member to pass through in a vertical direction is formed; and in the insertion hole, a spring holding member that holds the spring is detachably provided.

In the upper plate biasing unit according to the present invention, it is desirable that the insertion hole include a stepped portion on an upper surface side of the lower plate, and the spring holding member include a flange portion fitted in the stepped portion.

In the upper plate biasing unit according to the present invention, it is desirable that in the guide member, a projection portion that locks an upper portion of the spring be provided.

An electrical component socket according to the present invention is an electrical component socket including a socket body that receives a first electrical component, the socket body being disposed on a second electrical component, the first electrical component and the second electrical component being electrically connected to each other via a contact element disposed in the socket body, wherein: the socket body includes a unit body disposed on the second electrical component, the unit body including a through hole that allows the contact element to be inserted therein, a floating plate that receives the first electrical component, the floating plate being supported above the unit body in such a manner that the floating plate is vertically movable, a guide member attached to the floating plate and supported by the unit body so as to be vertically movable, the guide member guiding vertical movement of the floating plate, and a spring provided below the guide member, the spring biasing the floating plate upward via the guide member; in the unit body, an insertion hole having a size that allows the spring and the guide member to pass therethrough in a vertical direction is formed; and in the insertion hole, a spring holding member that holds the spring is detachably provided.

Advantageous Effects of Invention

The upper plate biasing unit according to the present invention enables suppression of warpage of the upper plate caused by a biasing force of the spring even if a flexural rigidity of the upper plate is small because a point of application of the biasing force of the spring to the upper plate and a point of support of the upper plate correspond to each other in plan view. In addition, the spring holding member is provided in a detachable manner, and thus, the spring and the guide member can be removed without disassembling the upper plate biasing unit. Accordingly, work for replacement of the upper plate or the spring can be performed easily and quickly.

In the upper plate biasing unit according to the present invention, the stepped portion is provided on the upper surface side of the lower plate in the insertion hole and the flange portion fitted in the stepped portion is provided in the spring holding member, enabling the spring holding member to be easily detached from the insertion hole and thus enabling work for removing the spring and the guide member to be performed easily.

In the upper plate biasing unit according to the present invention, the projection portion that locks the upper portion of the spring is provided in the guide member, enabling work required from attachment of the spring to fitting of the spring holding member to be performed efficiently in, e.g., replacing the upper plate or the spring.

In the electrical component socket according to the present invention, a point of application of a biasing force of the spring to the floating plate and a point of support of the floating plate correspond to each other in plan view, enabling suppression of warpage of the floating plate caused by the biasing force of the spring even if a flexural rigidity of the floating plate is small. In addition to this, the spring holding member is provided in a detachable manner, enabling the spring and the guide member to be removed without disassembling the socket body. Therefore, work for replacing the floating plate or the spring can easily and quickly be performed.

DESCRIPTION OF EMBODIMENTS

Figure 1A:
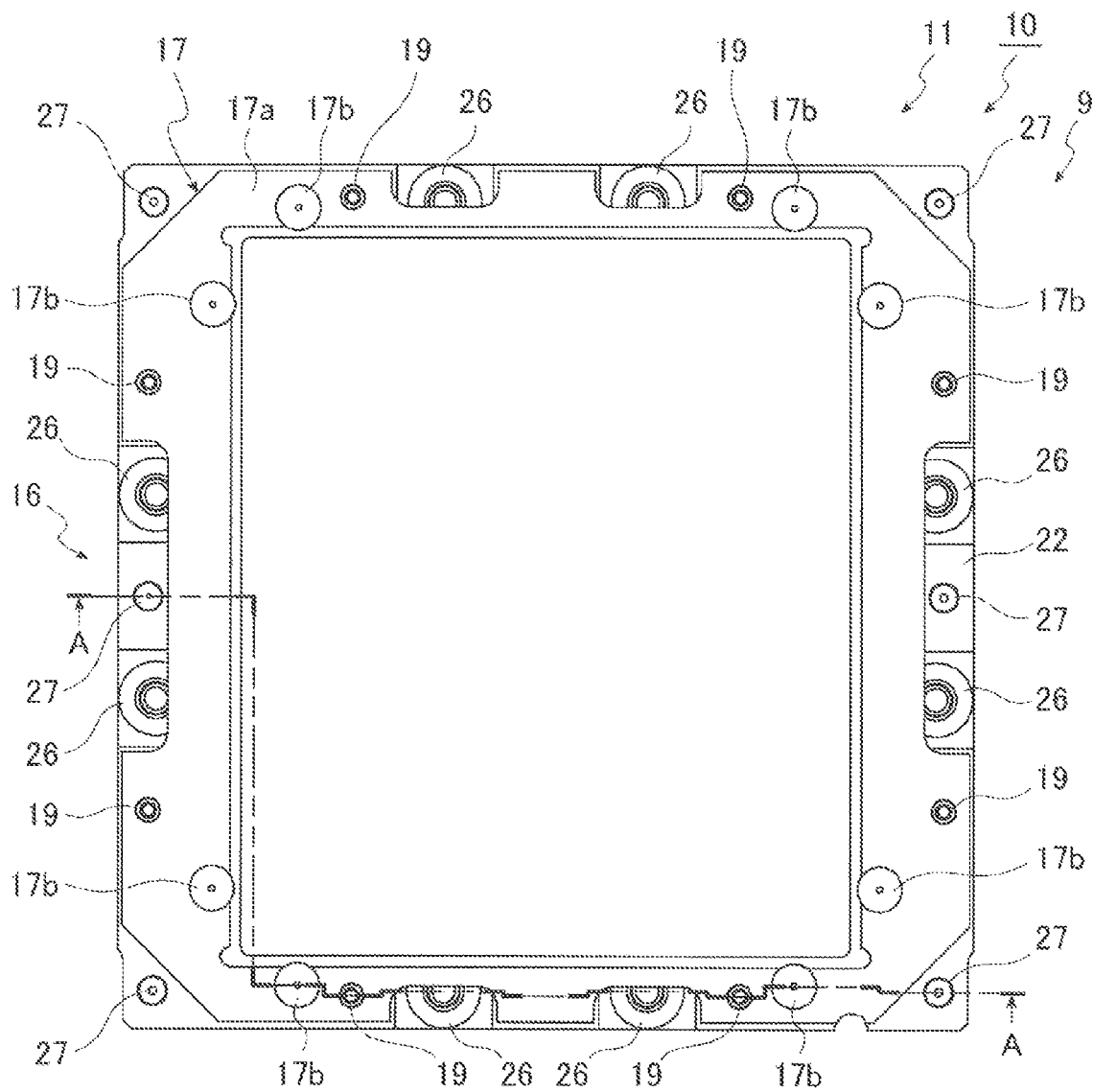
FIG. 1A is a plan view illustrating a unit in an IC socket according to Embodiment 1 of this invention.

Embodiments of this invention will be described.

Embodiment 1 of Invention

FIGS. 1A to 3E illustrate Embodiment 1 of this invention.

First, a configuration of Embodiment 1 will be described. An IC socket 10, which corresponds to an "electrical component socket", is configured so as to be disposed on a wiring substrate 13, which corresponds to a "second electrical component", and is intended to electrically connect an IC package 12, which corresponds to a "first electrical component", and the wiring substrate 13 in order to conduct, e.g., a burn-in test of the IC package 12. The IC socket 10 includes a socket body 9 that receives the IC package 12 and is disposed on the wiring substrate 13, and a non-illustrated pressing mechanism that presses the IC package 12 on the socket body 9 downward.

The socket body 9 includes a non-illustrated frame body and a unit (contact module) 11 supported in the frame body.

As illustrated in FIGS. 1A to 3E, the unit 11 includes a unit body 16 that is disposed on the wiring substrate 13 and includes numerous through holes 22a, 23a and 24a formed therein, the numerous through holes 22a, 23a and 24a allowing contact elements (contact pins) 15 to be inserted therein, a floating plate 17, which corresponds to an "upper plate", the floating plate 17 receiving the IC package 12 and being supported above the unit body 16 so as to be vertically movable, rivets 19, which correspond to a plurality of "guide members", the rivets 19 being attached to the floating plate 17 and supported by the unit body 16 so as to be vertically movable, and guiding vertical movement of the floating plate 17, and a plurality of springs 20 provided below the rivets 19, the plurality of springs 20 biasing the floating plate 17 upward via the rivets 19. Also, in the unit body 16, a plurality of insertion holes 29 each having a size that allows the corresponding spring 20 and rivet 19 to pass therethrough in a vertical direction (vertical direction in FIG. 1B) is formed. Furthermore, in these insertion holes 29, a plurality of spring holding members 28 that hold the respective springs 20 are detachably provided.

Figure 1B:
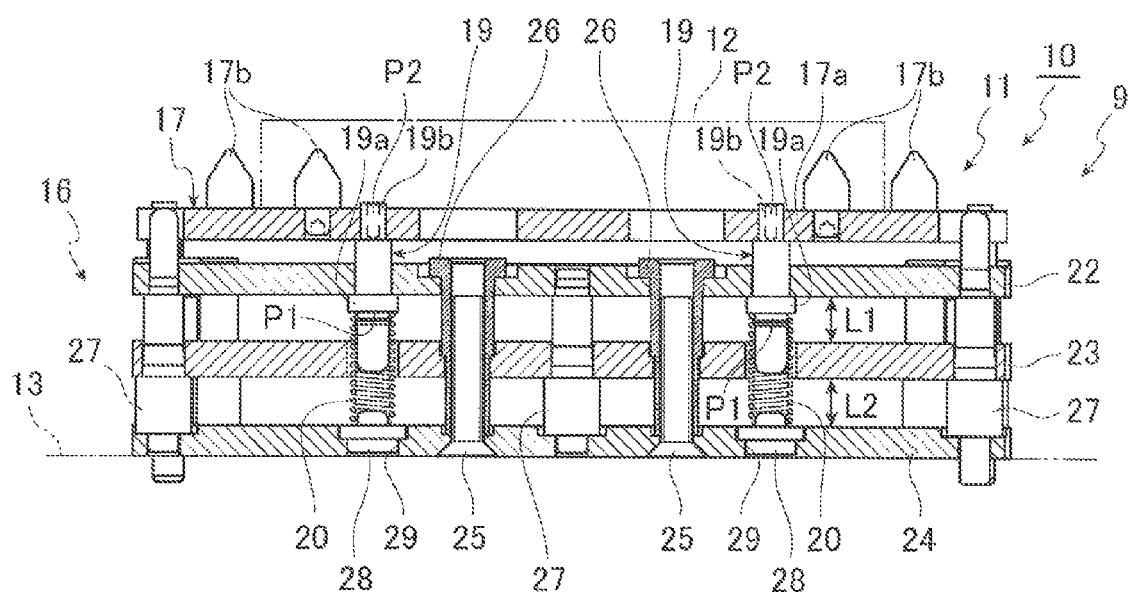
FIG. 1B is a cross-sectional view along line A-A in FIG. 1A.

More specifically, as illustrated in FIG. 1B, the unit body 16 includes, e.g., a first plate 22, a second plate 23, and a third plate 24, which corresponds to a "lower plate". These three plates 22, 23 and 24 are integrally fixed with predetermined spaces L1 and L2 maintained as a result of a plurality of stepped column-shaped spacers 27 being fitted in all of the plates 22, 23 and 24 and a number of bolts 25, the number being the same as that of a plurality of sleeves 26 fitted in the first plate 22 and the second plate 23, being threadably connected to the plurality of sleeves 26 from a lower surface of the third plate 24.

Figure 2:
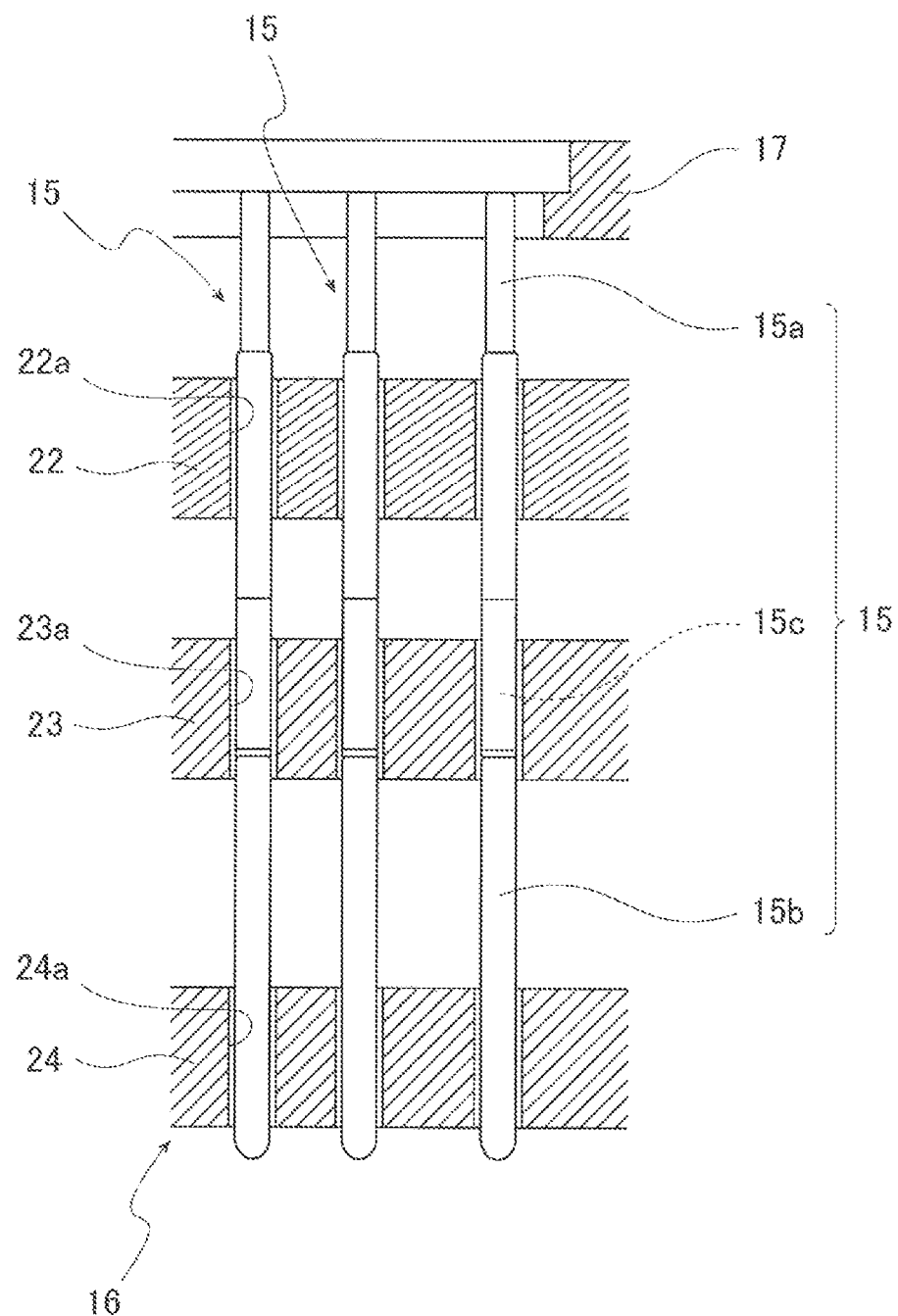
FIG. 2 is an enlarged cross-sectional view illustrating a relationship between the unit and contact elements in the IC socket according to Embodiment 1 of this invention.

Also, on the center portion side of the first plate 22, the second plate 23 and the third plate 24, as illustrated in FIG. 2, numerous through holes 22a, 23a and 24a are formed in the vertical direction, respectively, and in the through holes 22a, 23a and 24a, the contact elements 15 are inserted and thereby disposed. The contact elements 15 each have a structure in which a stepped cylinder-shaped barrel 15a and a round rod-shaped plunger 15b are extensibly joined via a spring 15c.

Also, as illustrated in FIGS. 1A and 1B, above the first plate 22, the floating plate 17 is supported so as to be vertically movable. The floating plate 17 includes a frame body 17a having a rectangular frame shape, and on the frame body 17a, eight mountain-like guide pins 17b are provided upright.

Furthermore, as illustrated in FIGS. 1A and 1B, upper end portions 19b of eight rivets 19 are fixed and thereby attached to the floating plate 17, and the rivets 19 are attached so as to extend through the first plate 22 and be slidable in the vertical direction. In the vicinity of a lower portion of each rivet 19, a flange portion 19a is formed so as to define an uppermost position of the floating plate 17 as a result of the flange portion 19a being brought into abutment with a lower surface of the first plate 22. Furthermore, between the flange portion 19a of each rivet 19 and the third plate 24, a spring 20 is disposed so as to elastically bias the rivet 19 upward, that is, to the floating plate 17 side.

Figure 3A:
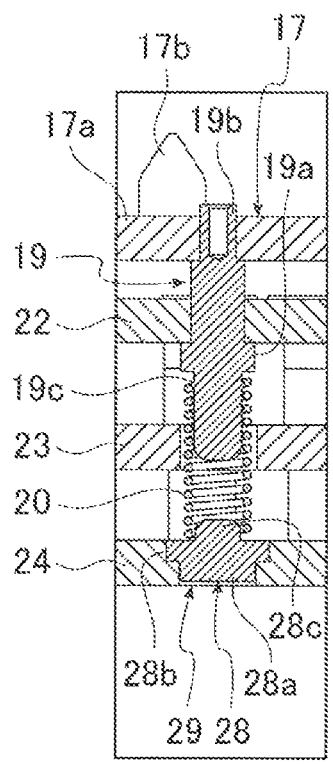
FIG. 3A is a cross-sectional view illustrating a procedure for removing a rivet in the unit in the IC socket according to Embodiment 1 of this invention.
Figure 3B:
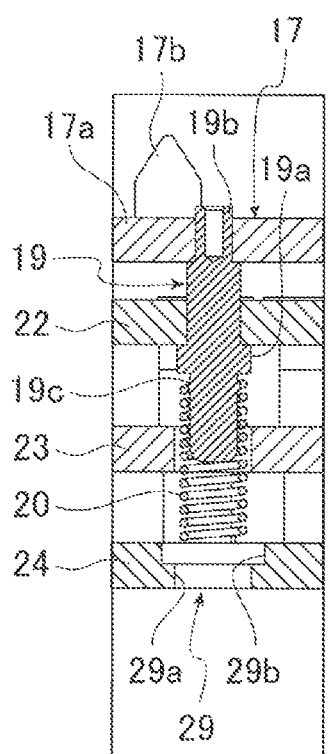
FIG. 3B is a cross-sectional view illustrating a procedure for removing the rivet in the unit in the IC socket according to Embodiment 1 of this invention.
Figure 3C:
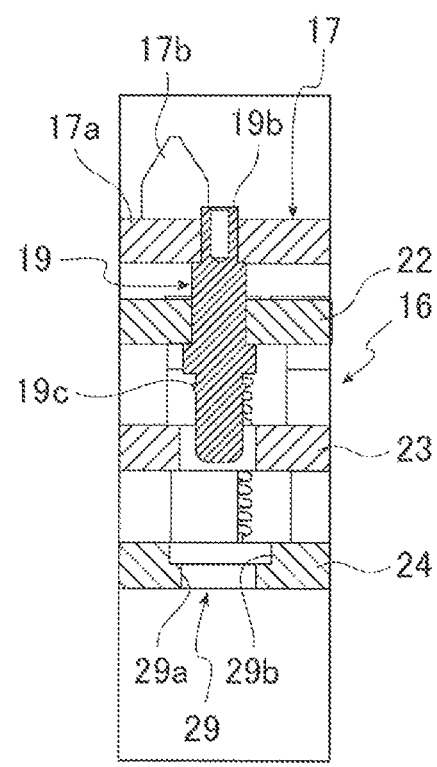
FIG. 3C is a cross-sectional view illustrating a procedure for removing the rivet in the unit in the IC socket according to Embodiment 1 of this invention.
Figure 3D:
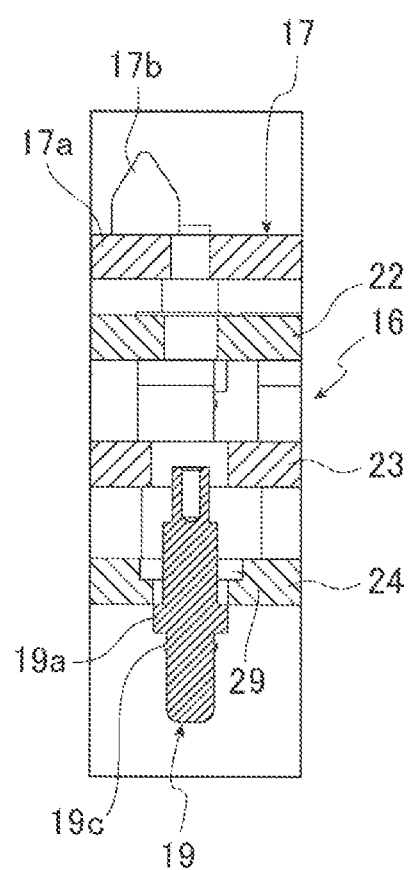
FIG. 3D is a cross-sectional view illustrating a procedure for removing the rivet in the unit in the IC socket according to Embodiment 1 of this invention.
Figure 3E:
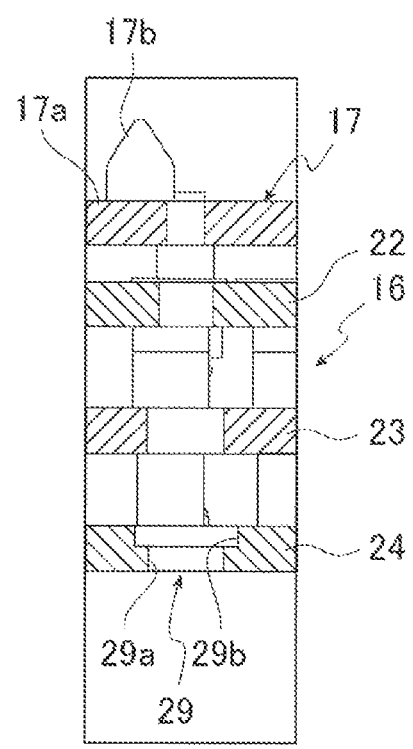
FIG. 3E is a cross-sectional view illustrating a procedure for removing the rivet in the unit in the IC socket according to Embodiment 1 of this invention.

Also, as illustrated in FIGS. 1B and 3A to 3E, in the lower-side plate 24 of the unit body 16, substantially-round insertion holes 29 each having a size that allows the corresponding spring 20 and rivet 19 to pass therethrough in the vertical direction (vertical direction in FIG. 1B) is formed so as to be extended through the lower-side plate 24 in the vertical direction. As illustrated in FIG. 3E, the insertion holes 29 each include a small-diameter hole body 29a and a large-diameter stepped portion 29b positioned on the upper surface side of the third plate 24. On the other hand, as illustrated in FIG. 3A, the spring holding members 28 each include a disk-like holding member body 28a, a flange portion 28b fitted in the stepped portion 29b of the corresponding insertion hole 29, and a projection portion 28c engaged with a lower portion of the corresponding spring 20. As illustrated in FIG. 3A, upon the holding member body 28a and the flange portion 28b of each spring holding member 28 being fitted in the hole body 29a and the stepped portion 29b of the corresponding insertion hole 29, the insertion hole 29 is occluded by the spring holding member 28. In this state, upon an upper end portion of each spring 20 being brought into contact with a lower surface of the flange portion 19a of the corresponding rivet 19 and a lower end portion of the spring 20 being brought into contact with an upper surface of the flange portion 28b of the corresponding spring holding member 28, the rivet 19 is biased upward by an elastic force of the spring 20.

Here, as illustrated in FIG. 3D, at an outer periphery on the lower side relative to the flange portion 19a of each rivet 19, a projection portion 19c is formed in an annular shape, and as illustrated in FIG. 3B, an upper portion of the corresponding spring 20 is locked by the projection portion 19c.

In the IC socket 10 having such configuration as above, as illustrated in FIG. 1B, a point P1 of application of a biasing force of each spring 20 to the corresponding rivet 19 attached to the floating plate 17 and a point (floating plate 17 and rivet 19 attachment part) P2 of support of the floating plate 17 on the unit body 16 correspond to each other in plan view. Thus, as opposed to conventional products in which the application point P1 and the support point P2 do not correspond to each other in plan view, even if a flexural rigidity of the floating plate 17 is small, warpage of the floating plate 17 caused by biasing forces of the springs 20 can be suppressed.

Accordingly, in the IC socket 10, biasing forces of the springs 20 can be set to be large with no consideration for warpage of the floating plate 17, enabling enhancement in versatility of the unit 11. Also, in the IC socket 10, the floating plate 17 can be made to be thin, enabling fulfillment of a demand for reduction in thickness of the floating plate 17, consequently, the unit 11. In addition, in the IC socket 10, each rivet 19 and the corresponding spring 20 are aligned in the vertical direction (vertical direction in FIG. 1B), and less space is needed in a planar direction of the unit 11, enabling enhancement in space-saving of the unit 11.

Next, usage of the IC socket 10 will be described.

First, the IC socket 10 is disposed on the wiring substrate 13. Then, the unit 11 rises against biasing forces of the springs 15c in such a manner that the plungers 15b of the contact elements 15 are pushed up by the wiring substrate 13, whereby lower end portions of the plungers 15b of the contact elements 15 and non-illustrated electrodes of the wiring substrate 13 are brought into contact with each other at a predetermined contact pressure.

Subsequently, in a state in which the floating plate 17 is at the uppermost position, the IC package 12 is put on the floating plate 17. Then, the IC package 12 is guided by the guide pins 17b of the floating plate 17 and then peripheral edge portions of the IC package 12 are supported by the frame body 17a of the floating plate 17.

Here, in the IC socket 10, as described above, warpage of the floating plate 17 caused by biasing forces of the springs 20 is suppressed, preventing a level of the IC package 12 mounted and a surface on which the IC package 12 is mounted from becoming unstable. As a result, capabilities of contacting and receiving the IC package 12 can be maintained.

Lastly, the IC package 12 on the floating plate 17 is pressed downward by the non-illustrated pressing mechanism of the IC socket 10. Then, the floating plate 17 falls down to a lowermost position together with the IC package 12 and the rivets 19. As a result, the IC socket 10 falls against biasing forces of the springs 15c in such a manner that the barrels 15a of the contact element 15 are pushed down by the IC package 12, whereby upper end portions of the barrels 15a of the contact elements 15 and non-illustrated terminals of the IC package 12 are brought into contact with each other at a predetermined contact pressure. Accordingly, the terminals of the IC package 12 and the electrodes of the wiring substrate 13 are electrically connected to each other via the contact elements 15.

Here, since in the IC socket 10, as described above, the level of the IC package 12 mounted and the surface on which the IC package 12 is mounted are prevented from becoming unstable, enabling avoidance of the pressing mechanism that presses the IC package 12 downward being adversely affected.

In this state, current is applied to the IC package 12 to conduct, e.g., a burn-in test.

There may be cases where the IC socket 10 requires replacement of the floating plate 17 according to the type of the IC package 12, and in such cases, all of the springs 20 and the rivets 19 are removed from the unit body 16 according to the following procedure.

First, caulking of the floating plate 17 with the rivets 19 is cancelled.

Next, the spring holding members 28 are removed from the insertion holes 29 of the lower-side plate 24. In order to do so, as illustrated in FIG. 3A, in a state in which the spring holding members 28 are fitted in the insertion holes 29, the springs 20 are contracted upward using a non-illustrated jig. Then, the spring holding members 28 are released from being pushed downward by the biasing forces of the springs 20, and thus, the spring holding members 28 are moved obliquely upward and removed. As a result, as illustrated in FIG. 3B, the insertion holes 29 become open.

Here, each insertion holes 29 includes a stepped portion 29b on the upper surface side of the third plate 24 and each spring holding member 28 includes a flange portion 28b to be fitted in the stepped portion 29b, providing a structure that allows the spring holding member 28 to be fitted in the insertion hole 29 from above. Thus, the spring holding members 28 can easily be attached/detached to/from the insertion holes 29, facilitating work for removing the springs 20 and the rivets 19, which will be described later.

Next, as illustrated in FIG. 3C, the springs 20 are pulled downward out from the insertion holes 29. Here, as described above, the insertion holes 29 each have a size that allows the respective springs 20 to pass therethrough in the vertical direction, enabling work for pulling out the springs 20 to be performed smoothly.

Subsequently, as illustrated in FIG. 3D, the rivets 19 are pulled downward out from the insertion holes 29. Here, as described above, the insertion holes 29 each have a size that allows the rivets 19 to pass therethrough in the vertical direction, enabling work for pulling the rivets 19 out to be performed smoothly.

Consequently, as illustrated in FIG. 3E, all of the springs 20 and the rivets 19 have been removed from the unit body 16. In this state, the floating plate 17 is replaced to another, and then, the springs 20 and the rivets 19 are attached to the unit body 16 in a procedure that is the reverse of the above-described procedure (the order of FIGS. 3E, 3D, 3C, 3B, 3A).

Here, as illustrated in FIG. 3B, upon each spring 20 being attached to the lower side of the corresponding rivet 19, the upper portion of the spring 20 is locked and supported by the projection portion 19c of the rivet 19, preventing the spring 20 from falling off and thus enabling work required from attachment of the springs 20 to fitting of the spring holding members 28 to be performed efficiently.

Here, the work for replacing the floating plate 17 ends.

As described above, in the IC socket 10 according to Embodiment 1, the insertion holes 29 each having a size that allows the corresponding spring 20 and rivet 19 to pass therethrough in the vertical direction are formed in the unit body 16 and the spring holding members 28 are detachably provided in the insertion holes 29, enabling the springs 20 and the rivets 19 to be removed without disassembling the socket body 9. Accordingly, where the floating plate 17 is replaced according to the type of the IC package 12, work for replacing the floating plate 17 can be performed easily and quickly.

Also, where the springs 20 are replaced in order to change a biasing force of the floating plate 17 (spring constant of the springs 20), the springs 20 are removed from the rivets 19 and then new springs 20 are attached to the rivets 19 according to a procedure that is similar to the above-described procedure.

In this case, the springs 20 can be removed without disassembling the socket body 9. Accordingly, where the springs 20 are replaced in order to change a biasing force of the floating plate 17 (spring constant of the springs 20), work for replacing the springs 20 can be performed easily and quickly.

Other Embodiments of Invention

Embodiment 1 above has been described in terms of a case where the insertion holes 29 each include a stepped portion 29b on the upper surface side of the third plate 24 and the spring holding members 28 each include a flange portion 28b fitted in the stepped portion 29b. However, the structures of the insertion holes 29 and the spring holding members 28 may be any structures as long as such structures enable spring holding members 28 to be detachably provided in the insertion holes 29. For example, a configuration in which a female thread portion is formed in each insertion hole 29 and a male thread portion is formed in each spring holding member 28 to the spring holding member 28 to be screwed into the insertion hole 29 from underneath may be provided.

Also, in Embodiment 1 above, a case where the unit body 16 includes three plates (the first plate 22, the second plate 23 and the third plate 24) has been described. However, the number of plates included in the unit body 16 is not specifically limited.

Also, although in Embodiment 1, the contact elements 15 each including a barrel 15a, a round rod-like plunger 15b and a spring 15c have been described, a type of contact elements 15 other than that type can be used.

Also, although in Embodiment 1 above, the socket body 9 of the type in which the unit 11 is supported in the frame body has been described, it should be understood that this invention is also applicable to a type of socket body 9 other than that type as long as such socket body 9 includes a floating plate 17, rivets 19 and springs 20.

Also, although in Embodiment 1 above, a case where guide members are the rivets 19 has been described, guide members (for example, tightly-wound coil springs) can be also used instead of the rivets 19 as long as such guide members have a function that guides vertical movement of the floating plate 17.

Also, although in Embodiment 1 above, this invention has been applied to an IC socket 10 including a pressing mechanism, it should be understood that the present invention is not limited to this case and is applicable also to, e.g., one with a pressing mechanism provided on the automatic machine side.

Furthermore, although in Embodiment 1 above, this invention has been applied to the IC socket 10, which is an example of "electrical component socket", it should be understood that the present invention is not limited to this case and is applicable also to other apparatuses. Furthermore, the present invention is applicable not only to electrical component sockets, and application of the present invention to an upper plate biasing unit generally including a lower plate, an upper plate (corresponding to the floating plate 17) provided above the lower plate in such a manner that the upper plate is biased so as to be vertically movable, a guide member attached to the upper plate, the guide member guiding vertical movement of the upper plate, and a spring provided below the guide member, the spring biasing the upper plate upward via the guide member enables provision of the effect of enabling work, that is similar to the effect described above, for replacing the upper plate and/or the spring to be performed easily and quickly in addition to an effect that the advantage of enabling suppression of warpage of the upper plate even if a flexural rigidity of the upper plate is small.

REFERENCE SIGNS LIST 9 socket body
10 IC socket (electrical component socket)
11 unit
12 IC package (first electrical component)
13 wiring substrate (second electrical component)

15 contact element
16 unit body
17 floating plate (upper plate)
19 rivet (guide member)
19c projection portion
20 spring
22 first plate
23 second plate
24 third plate (lower plate)
28 spring holding member
28b flange portion
29 insertion hole
29b stepped portion

The invention claimed is:

1. An upper plate biasing unit including a lower plate, an upper plate provided above the lower plate in such a manner that the upper plate is biased so as to be vertically movable, a guide member attached to the upper plate, the guide member guiding vertical movement of the upper plate, and a spring provided below the guide member, the spring biasing the upper plate upward via the guide member, wherein:

in the lower plate, an insertion hole having a size that allows the spring and the guide member to pass through in a vertical direction is formed; and in the insertion hole, a spring holding member that holds the spring is detachably provided.

2. The upper plate biasing unit according to claim 1, wherein the insertion hole includes a stepped portion on an upper surface side of the lower plate, and the spring holding member includes a flange portion fitted in the stepped portion.

3. The upper plate biasing unit according to claim 1, wherein in the guide member, a projection portion that locks an upper portion of the spring is provided.

4. An electrical component socket including a socket body that receives a first electrical component, the socket body being disposed on a second electrical component, the first electrical component and the second electrical component being electrically connected to each other via a contact element disposed in the socket body, wherein:

the socket body includes a unit body disposed on the second electrical component, the unit body including a through hole that allows the contact element to be inserted therein, a floating plate that receives the first electrical component, the floating plate being supported above the unit body in such a manner that the floating plate is vertically movable, a guide member attached to the floating plate and supported by the unit body so as to be vertically movable, the guide member guiding vertical movement of the floating plate, and a spring provided below the guide member, the spring biasing the floating plate upward via the guide member;

in the unit body, an insertion hole having a size that allows the spring and the guide member to pass therethrough in a vertical direction is formed; and in the insertion hole, a spring holding member that holds the spring is detachably provided.

* * * * *